United States Patent
Ooishi et al.

(10) Patent No.: US 8,504,964 B2
(45) Date of Patent: Aug. 6, 2013

(54) THROUGH-HOLE LAYOUT APPARATUS THAT REDUCES DIFFERENCES IN LAYOUT DENSITY OF THROUGH-HOLES

(75) Inventors: Hayato Ooishi, Chuo-ku (JP); Kazuhiko Matsuki, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 408 days.

(21) Appl. No.: 12/478,834

(22) Filed: Jun. 5, 2009

(65) Prior Publication Data

US 2009/0307648 A1 Dec. 10, 2009

(30) Foreign Application Priority Data

Jun. 6, 2008 (JP) .................................. 2008-149172

(51) Int. Cl.
*G06F 17/50* (2006.01)
(52) U.S. Cl.
USPC ........... 716/119; 716/118; 716/122; 716/139; 716/101

(58) Field of Classification Search
None
See application file for complete search history.

(56) References Cited

U.S. PATENT DOCUMENTS

| | | | | |
|---|---|---|---|---|
| 6,035,108 A * | 3/2000 | Kikuchi | ........................ | 716/122 |
| 6,546,543 B1 * | 4/2003 | Manabe et al. | .................. | 716/52 |
| 7,134,111 B2 * | 11/2006 | Nakamoto | .................... | 257/774 |
| 7,269,813 B2 * | 9/2007 | Brown | .......................... | 716/126 |
| 7,587,696 B2 * | 9/2009 | Nakamoto | ..................... | 716/130 |
| 7,698,676 B1 * | 4/2010 | Qian | ............................. | 716/119 |
| 8,219,955 B2 * | 7/2012 | Tsubamoto et al. | .......... | 716/115 |
| 2002/0024831 A1 * | 2/2002 | Yamaguchi et al. | ............ | 365/63 |
| 2004/0232445 A1 * | 11/2004 | Nakamoto | ..................... | 257/202 |
| 2005/0028125 A1 * | 2/2005 | Watanabe et al. | ............... | 716/13 |
| 2008/0059934 A1 * | 3/2008 | Igeta | .............................. | 716/13 |
| 2010/0289150 A1 * | 11/2010 | Hamanaka | ..................... | 257/773 |
| 2011/0041113 A1 * | 2/2011 | Nozawa et al. | ............... | 716/130 |

FOREIGN PATENT DOCUMENTS

| | | |
|---|---|---|
| JP | 10-189742 A | 7/1998 |
| JP | 2003-124334 A | 4/2003 |
| JP | 2005-135971 A | 5/2005 |
| JP | 2005-251796 A | 9/2005 |
| JP | 2005-322689 A | 11/2005 |
| JP | 2006-019690 A | 1/2006 |
| JP | 2006-049534 A | 2/2006 |

* cited by examiner

*Primary Examiner* — A. M. Thompson
(74) *Attorney, Agent, or Firm* — Sughrue Mion, PLLC

(57) ABSTRACT

A through-hole layout apparatus and method for reducing differences in layout density of through-holes. The through-hole layout apparatus includes an extractor, which extracts an existing through-hole from design data for a semiconductor integrated circuit, a calculator, which calculates a layout density of through-holes in a predetermined region for each through-hole extracted by the extractor, a selector, which selects a through-hole at the center of a predetermined region where the layout density is lower than a predetermined value as a target through-hole from among the through-holes extracted by the extractor and a through-hole adder, which determines a given position in a predetermined region centered on the target through-hole as a placement position at which a through-hole is to be added for each target through-hole selected by the selector.

22 Claims, 14 Drawing Sheets

☐ : UPPER LAYER WIRING 301   ▦ : THROUGH-HOLE 303
▒ : LOWER LAYER WIRING 302

▢ : UPPER LAYER WIRING 61
▨ : LOWER LAYER WIRING 62
▦ : THROUGH-HOLE 63

▢ : UPPER LAYER WIRING 61
▨ : INTERLAYER WIRING 66
▨ : LOWER LAYER WIRING 62
▦ : THROUGH-HOLE 63
▦ : THROUGH-HOLE 67

☐ : UPPER LAYER WIRING 61
▨ : INTERLAYER WIRING 66
▦ : LOWER LAYER WIRING 62
▩ : THROUGH-HOLE 63
▦ : THROUGH-HOLE 67

☐ : UPPER LAYER WIRING 61
▨ : INTERLAYER WIRING 66
▦ : LOWER LAYER WIRING 62
▩ : THROUGH-HOLE 63
▦ : THROUGH-HOLE 67

☐ : UPPER LAYER WIRING 71

▨ : LOWER LAYER WIRING 72

▦ : THROUGH-HOLE 73

☐ : UPPER LAYER WIRING 71

▨ : INTERLAYER WIRING 76

▦ : LOWER LAYER WIRING 72

▦ : THROUGH-HOLE 73

▦ : THROUGH-HOLE 77

☐ : UPPER LAYER WIRING 71
▨ : INTERLAYER WIRING 76
▦ : LOWER LAYER WIRING 72
▩ : THROUGH-HOLE 73
▦ : THROUGH-HOLE 77

☐ : UPPER LAYER WIRING 71
▨ : INTERLAYER WIRING 76
▦ : LOWER LAYER WIRING 72
▩ : THROUGH-HOLE 73
▦ : THROUGH-HOLE 77

US 8,504,964 B2

THROUGH-HOLE LAYOUT APPARATUS THAT REDUCES DIFFERENCES IN LAYOUT DENSITY OF THROUGH-HOLES

This application is based upon and claims the benefit of priority from Japanese Patent Application No. 2008-149172 filed on Jun. 6, 2008, the content of which is incorporated by reference.

BACKGROUND OF THE INVENTION

1. Field of the Invention

The present invention relates to a through-hole layout apparatus and a through-hole layout method.

2. Description of Related Art

In semiconductor integrated-circuits in general, through-holes are provided for interconnecting wirings in upper and lower layer wirings.

In designing a semiconductor integrated-circuit, through-holes are densely placed in some regions and sparsely placed in other regions on each wiring layer because the through-holes occupy a small area of the data area of each wring layer. Here, the data area is the area to which a process is actually applied by exposure and masking.

FIG. 1A shows an example of a layout based on semiconductor integrated circuit design data according to the related art. FIG. 1B shows a pattern of through-holes extracted from the layout shown in FIG. 1A. It can be seen from the extracted through-hole pattern in FIG. 1B that there are regions where through-holes 303 are densely placed and regions where through-holes 303 are sparsely placed.

It is known that through-holes in a sparsely placed region tend to be deformed by defocusing during a diffusion step for processing through-holes in a semiconductor integrated circuit fabrication process as compared with those in a densely placed region. Deformation of through-holes 303 causes problems such as an increase in the resistance of a contact between upper layer wiring 301 and lower layer wiring 302 or an imperfectly opening a through-hole to interconnect upper layer 301 and lower layer wiring 302.

Thus, differences in the layout density of though-holes cause variations in shapes and dimensions of formed through-holes, leading to yield loss of the semiconductor integrated circuit.

To solve the yield loss problem due to differences in layout density of through-holes, techniques are disclosed in Japanese Patent Laid-Open No. 2005-251796 (hereinafter referred to as Patent Document 1) and No. 2006-049534 (hereinafter referred to as Patent Document 2) that make the shapes of through-holes uniform.

In the technique described in Patent Document 1, a dummy pattern is added that includes slits surrounding each through-hole and the width of the dummy pattern and the distance between the slit and each through-hole are controlled to adjust the amount of shrinkage during processing of the through-holes, thereby making the shapes of the through-holes uniform.

In the technique described in Patent Document 2, instead of through-holes, dummy patterns that are smaller than through-holes are provided around the through-holes in a region where through-holes are sparsely placed to avoid variations in density in the process pattern during through-hole processing, thereby making the shapes of the through-holes uniform. The dimensions of the dummy pattern are adjusted so that the dummy patterns do not pass through the upper and lower layer wirings during processing of the through-holes.

However, the techniques described in Patent Documents 1 and 2 have the following problems.

In the techniques disclosed in Patent Documents 1 and 2, the dummy pattern, which is not specified in a process design criterion which is a set of design rules for a semiconductor integrated circuit, is added to design data. Accordingly, exposure conditions need to be determined by using an additional optical simulation by taking the dummy pattern into consideration to determine the amount of optical correction and a data process flow. Consequently, the number of development steps significantly increases.

Another problem with the techniques described in Patent Documents 1 and 2 is that addition of a dummy pattern to semiconductor integrated circuit design data adds to the complexity of the process of inspection of the semiconductor integrated circuit.

SUMMARY

In one embodiment, there is provided a through-hole layout apparatus that includes: an extractor extracting an existing through-hole from design data for a semiconductor integrated circuit; a calculator calculating, for each through-hole extracted by the extractor, a layout density of through-holes in a predetermined region; a selector selecting a through-hole at the center of a predetermined region where the layout density is lower than a predetermined value as a target through-hole from among the through-holes extracted by the extractor; and a through-hole adder determining, for each target through-hole selected by the selector, a given position in a predetermined region centered on the target through-hole as a placement position at which a through-hole is to be added.

In one embodiment, there is provided a through-hole layout method which is performed by a through-hole layout apparatus and which includes: extracting an existing through-hole from design data for a semiconductor integrated circuit; calculating, for each extracted through-hole, a layout density of through-holes in a predetermined region; selecting a through-hole at the center of a predetermined region where the calculated layout density is lower than a predetermined value as a target through-hole from among the extracted through-holes; and determining, for each selected target through-hole, a given position in a predetermined region centered on the target through-hole as a placement position at which a through-hole is to be added.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Exemplary Embodiment

Figure 1A:
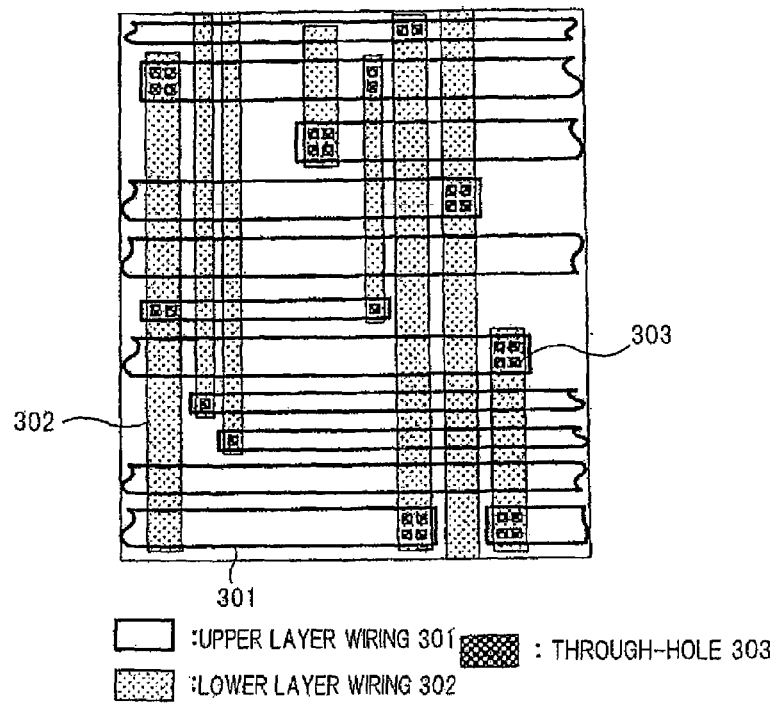
FIG. 1A is a diagram showing an exemplary layout based on semiconductor integrated circuit design data of the related art.
Figure 1B:
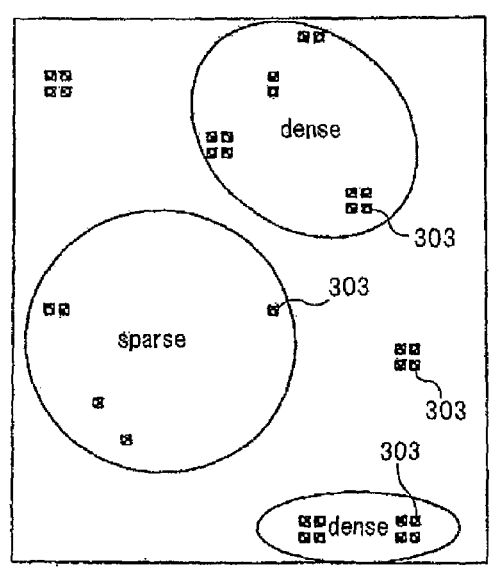
FIG. 1B is a diagram showing a pattern of through-holes extracted from the layout shown in FIG. 1A.
Figure 2:
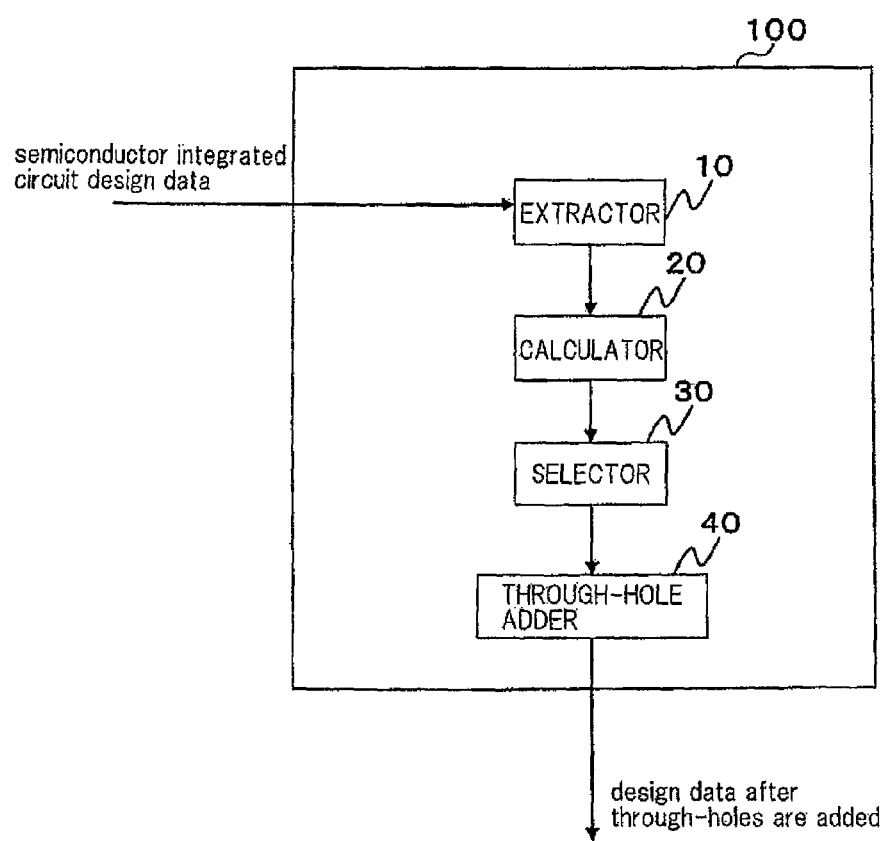
FIG. 2 is a block diagram showing a configuration of a through-hole layout apparatus according to a first exemplary embodiment of the present invention.

FIG. 2 shows a configuration of a through-hole layout apparatus according to a first exemplary embodiment of the present invention.

When design data for a semiconductor integrated circuit designed to meet functional requirements is input in the through-hole layout apparatus of the exemplary embodiment, the through-hole layout apparatus places additional through-holes in the input design data.

As shown in FIG. 2, through-hole layout apparatus 100 of the present exemplary embodiment includes extractor 10, calculator 20, selector 30, and through-hole adder 40.

Extractor 10 extracts existing through-holes that interconnect upper layer wirings and lower layer wirings from input design data.

Calculator 20 calculates the layout density of through-holes in a predetermined region centered on each through-hole extracted by extractor 10.

Selector 30 determines, for each through-hole extracted by extractor 10, whether the layout density calculated by calculator 20 is greater than or equal to a predetermined value. Based on the result of the determination, selector 30 selects the central through-hole in each region where the layout density is lower than the predetermined value as a target through-hole.

Through-hole adder 40 determines a given position in the predetermined region centered on each target through-hole selected by selector 30 as a placement position at which a through-hole is to be added and adds the through-hole at the placement position on the design data.

In particular, through-hole adder 40 performs the following process for each target through-hole.

First, through-hole adder 40 determines that, as a placement position at which a through-hole is to be added, a position in a predetermined region centered on the target through-hole that is at a predetermined distance from the target through-hole in a predetermined direction, is on an upper layer wiring connecting to the target through-hole, and is a position where no through-hole is placed.

The "predetermined direction" is any of the following eight directions in an XY coordinate plane with the origin at a target through-hole in a target-through-hole planar layout. The eight directions are: the positive and negative directions along the X-axis, the positive and negative directions along the Y-axis, the direction from the origin to the coordinates (1, 1), the direction from the origin to the coordinates (1, −1), the direction from the origin to the coordinates (−1, 1), and the direction from the origin to the coordinates (−1, −1).

In the following description, the positive direction along the X-axis is referred to as "right", the negative direction along the X-axis is referred to as "left", the positive direction along the Y-axis is referred to as "above", and the negative direction along the Y-axis is referred to as "below". The direction from the origin to the coordinates (1, 1) is referred to as "upper right", the direction from the origin to the coordinates (1, −1) is referred to as "lower right", the direction from the origin to the coordinates (−1, 1) is referred to as "upper left", and the direction from the origin to the coordinates (−1, −1) is referred to as "lower left".

The "predetermined distance" is the distance between adjacent through-holes specified in a process design criterion.

Then, through-hole adder 40 determines whether there is room for extending a lower layer wiring that is connected to the target through-hole to a position corresponding to the placement position.

If there is room for extending the lower layer wiring line, through-hole adder 40 extends the lower layer wiring to the position corresponding to the placement position and through-hole adder 40 adds a through-hole that interconnects the upper layer wiring and the lower layer wiring at the placement position on the design data. Hereinafter, the through-hole that interconnects the upper layer wiring and the lower layer wiring, is called through-hole for lower layer wiring.

On the other hand, if there is no room for extending the lower layer wiring, for example, because extension of the lower layer wiring would bring the lower layer wiring into electric contact with an adjacent lower layer wiring, through-hole adder 40 places an interlayer wiring at the position corresponding to the placement position between the upper layer wiring and the lower layer wiring and adds a through-hole that interconnects the upper layer wiring and the interlayer wiring at the placement position on the design data. Hereinafter, the through-hole that interconnects the upper layer wiring and the interlayer wiring, is called through-hole for interlayer wiring.

Operation of through-hole layout apparatus 100 according to the present exemplary embodiment will be described with respect to the flowchart shown in FIG. 3.

Figure 3:
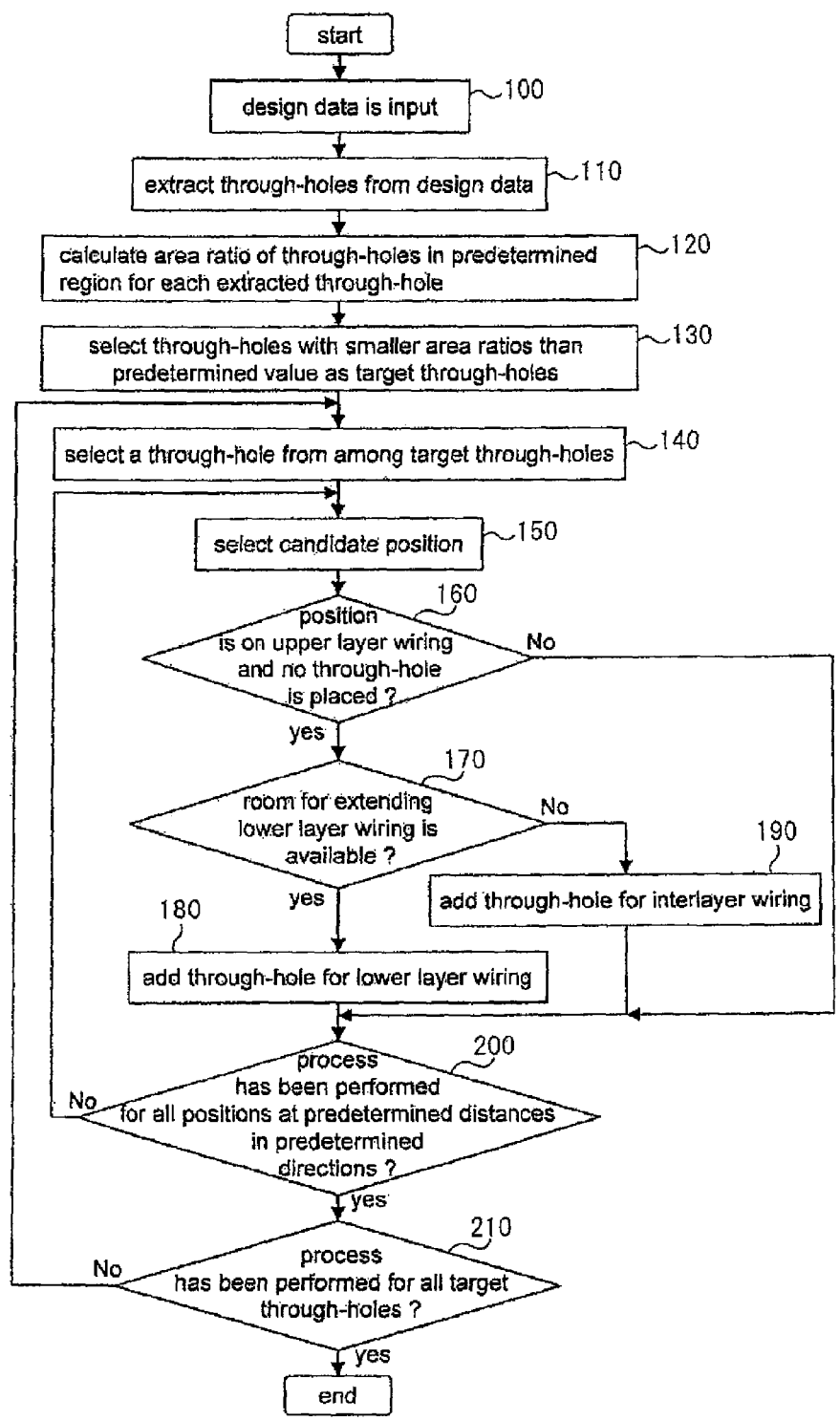
FIG. 3 is a flowchart illustrating operation of the through-hole layout apparatus shown in FIG. 2.
Figure 4A:
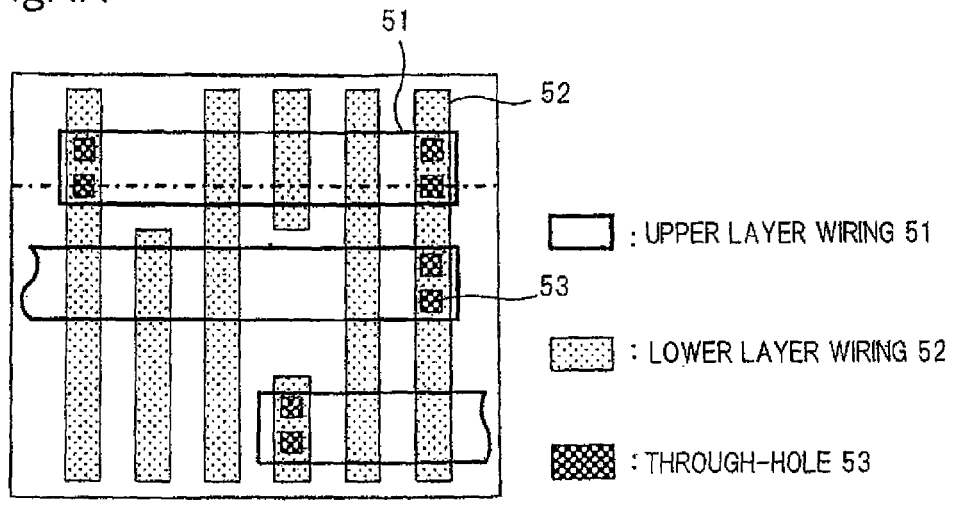
FIGS. 4A and 4B are diagrams showing exemplary design data for a semiconductor integrated circuit.
Figure 4B:
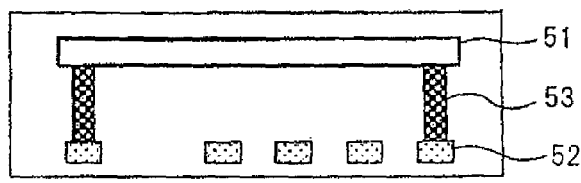

Referring to FIG. 3, design data for a semiconductor integrated circuit is first input in the through-hole layout apparatus (step 100). It is assumed here that the semiconductor integrated circuit design data shown in FIGS. 4A and 4B are input. FIG. 4A is a top view of the semiconductor integrated circuit and FIG. 4B is a cross-sectional view taken along the dashed line in the upper part (the same applies to FIGS. 7A, 7B, 8A, 8B, and 11A through 18B).

While upper layer wiring 51 and lower layer wiring 52 are placed orthogonal to each other for effective use of space in FIG. 4A, they do not necessarily need to be placed orthogonal to each other. On semiconductor integrated circuit design data, typically one or two through-holes are placed in order to interconnect an upper layer wiring and a lower layer wiring. This is because the use of a minimal number of through-holes for interconnection between upper and lower layer wirings can save space. In some cases, many through-holes may be provided. However, when many through-holes are provided, the through-holes are usually placed densely enough to prevent deformation of the through-holes. Therefore, description of a through-hole layout where many through-holes are placed will be omitted here.

Figure 5:
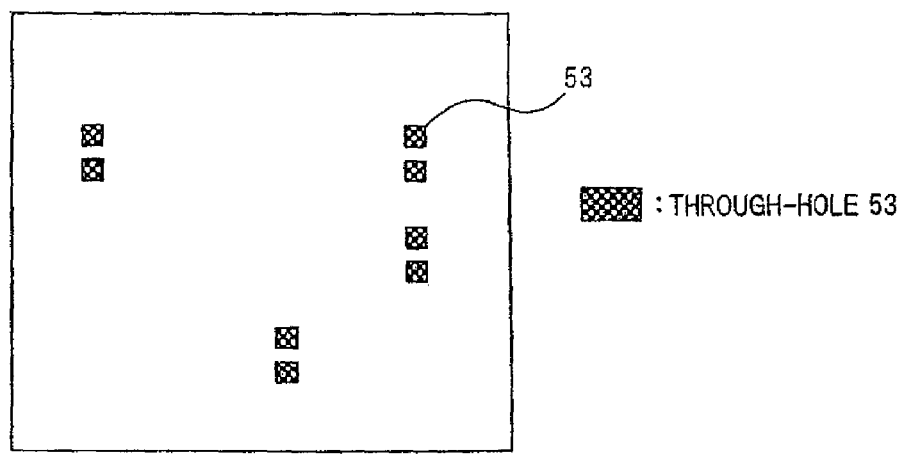
FIG. 5 is a diagram illustrating operation of the through-hole layout apparatus shown in FIG. 2.
Figure 6:
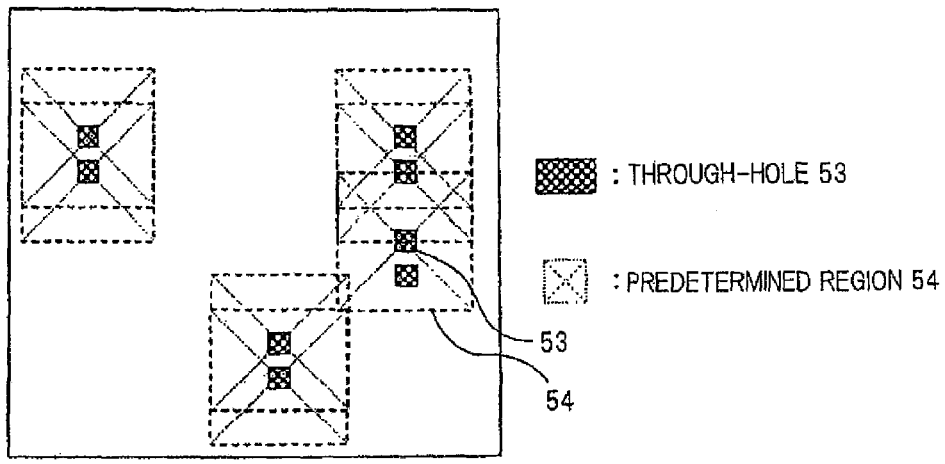
FIG. 6 is a diagram illustrating operation of the through-hole layout apparatus shown in FIG. 2.

Extractor 10 extracts existing through-holes 53 as shown in FIG. 5 from the design data shown in FIG. 4A (step 110).

Then, calculator 20 calculates, for each of through-holes 53 extracted by extractor 10 in FIG. 5, the area ratio of the through-holes in a predetermined region centered on the through-hole as the layout density of the through-holes (step 120). While the predetermined region here is rectangular in shape, the predetermined region may be circular. The area ratio can be obtained as: (area of through-holes in predetermined region×100)/area of predetermined region. While the area ratio is calculated as the layout density in the present exemplary embodiment, other ratios such as the population ratio of through-holes may be calculated.

Then, selector 30 determines, for each of through-holes 53 extracted by extractor 10, whether the area ratio calculated by calculator 20 is greater than or equal to a predetermined value. Based on the result of the determination, selector 30 selects through-holes for which the area ratios are smaller than the predetermined value as target through-holes (step 130). It is assumed here that multiple through-holes including through-holes 53a, 53b in FIGS. 7A and 7B are selected as target through-holes.

Figure 7A:
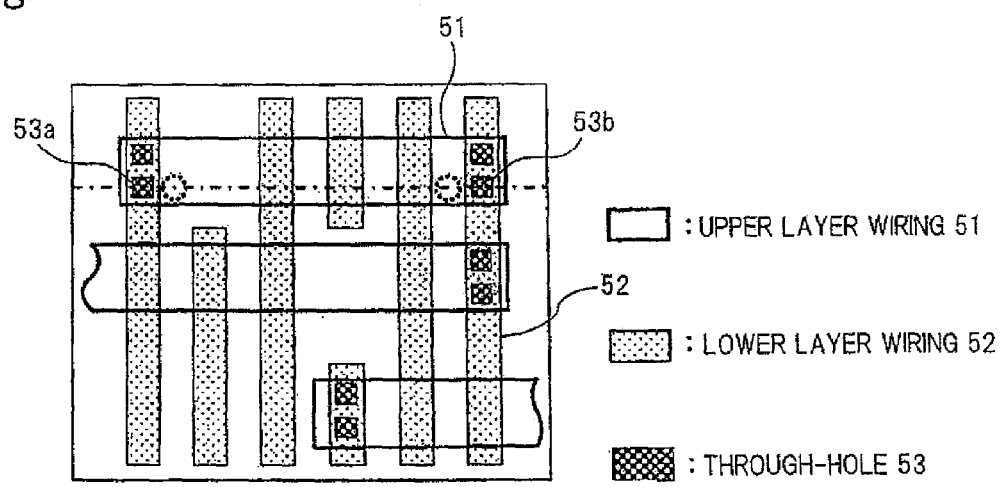
FIGS. 7A and 7B are diagrams illustrating operation of the through-hole layout apparatus shown in FIG. 2.
Figure 7B:
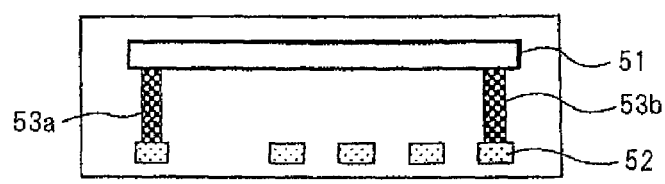

Then, through-hole adder 40 selects one from among the target through-holes in FIGS. 7A and 7B selected by selector 30 (step 140). It is assumed here that through-hole 53a is selected.

Through-hole adder 40 then selects a position in the predetermined region centered on through-hole 53a that is spaced away from through-hole 53a in a predetermined direction as a candidate position (step 150). It is assumed here that a position (indicated by a dotted circle in FIG. 7A) at a predetermined distance to the right from through-hole 53a is selected as the candidate position.

Through-hole adder 40 determines whether the candidate position is on upper layer wiring 51 that is connected to through-hole 53a and is a position where no through-hole is placed (step 160).

Here, the candidate position is on upper layer wiring 51 and is a position where no through-hole is placed, as shown in FIGS. 7A and 7B. Therefore through-hole adder 40 selects the candidate position as the placement position.

Through-hole adder 40 then determines whether there is room for extending lower layer wiring 52 that is connected to through-hole 53a to a position corresponding to the placement position (step 170).

Figure 8A:
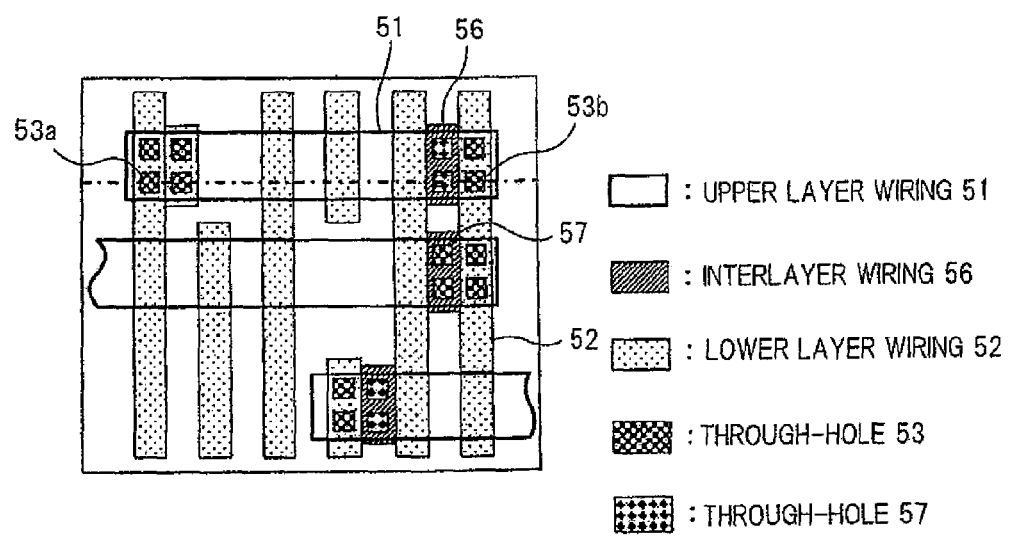
FIGS. 8A-8D are diagrams illustrating operation of the through-hole layout apparatus shown in FIG. 2.
Figure 8B:
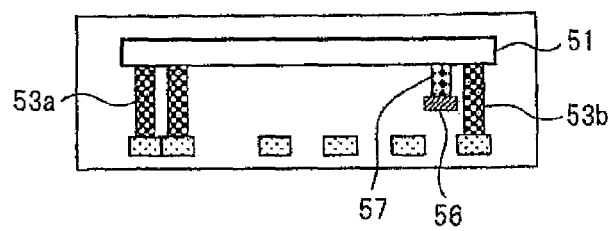

Here, there is room for extending lower layer wiring 52 as shown in FIGS. 7A and 7B. Therefore through-hole adder 40 extends lower layer wiring 52 to the position corresponding to the placement position and places through-hole 53 for lower layer wiring at the placement position on the design data as shown in FIGS. 8A and 8B (step 180).

Then, through-hole adder 40 performs steps 150 through 190 for all positions at predetermined distances from through-hole 53a in predetermined directions in the predetermined region centered on through-hole 53a (step 200). As a result, another through-hole 53 for lower layer wiring is added at the position on the design data at the predetermined distance to the upper right from through-hole 53a as shown in FIGS. 8A and 8B.

If there is an additional target through-hole selected by selector 30 that has yet to be subjected to processing in steps 140 through 200 (step 210), the through-hole adder 40 returns to step 140 and selects the next target through-hole. It is assumed here that through-hole 53b in FIGS. 7A and 7B is selected.

Then, through-hole adder 40 selects a position in a predetermined region centered on through-hole 53b that is spaced away from through-hole 53b in a predetermined direction as a candidate position (step 150). It is assumed here that a position (indicated by another dotted circle in FIG. 7A) at a predetermined distance to the left from through-hole 53b is selected as the candidate position.

Through-hole adder 40 determines whether the candidate position is on an upper layer wiring 51 that is connected to through-hole 53b and is a position where no through-hole is placed (step 160).

Here, the candidate position is on upper layer wiring 51 and is a position where no through-hole is placed, as shown in FIGS. 7A and 7B. Therefore through-hole adder 40 selects the candidate position as the placement position.

Through-hole adder 40 then determines whether there is room for extending lower layer wiring 52 that is connected to through-hole 53b to a position corresponding to the placement position (step 170).

Here, there is no room for extending lower layer wiring 52 as shown in FIGS. 7A and 7B. Therefore through-hole adder 40 places interlayer wiring 56 in a position corresponding to the placement position between upper layer wiring 51 and lower layer wiring 52 and adds through-hole 57 for interlayer wiring at the placement position on the design data (step 190).

Then, through-hole adder 40 performs steps 150 through 190 for all positions at the predetermined distances from through-hole 53b in predetermined directions in the predetermined region centered on through-hole 53b (step 200). As a result, another through-hole 57 for interlayer wiring is added at the position on the design data at the predetermined distance to the upper left from through-hole 53b as shown in FIGS. 8A and 8B.

When steps 140 through 200 have been performed for all target through-holes selected by selector 30, through-hole adder 40 will end the adding process.

As has been described above, according to the present exemplary embodiment, existing through-holes are extracted from design data for a semiconductor integrated circuit, the layout density of through-holes in a predetermined region centered on each extracted through-hole is calculated, and a through-hole is added at a given position in a predetermined region centered on a through-hole where the layout density is lower than a predetermined value, on the design data.

As a result, differences in through-hole layout density are reduced and therefore the yield of semiconductor integrated circuits can be increased without using a dummy pattern which is not specified in a process design criterion.

Therefore, the number of steps for developing a semiconductor integrated circuit is not significantly increased and the complicity of the process of inspecting the semiconductor integrated circuit is not increased.

Further to FIGS. 8A and 8B, FIGS. 8C and 8D show another illustration of the through-hole layout apparatus.

Figure 8C:
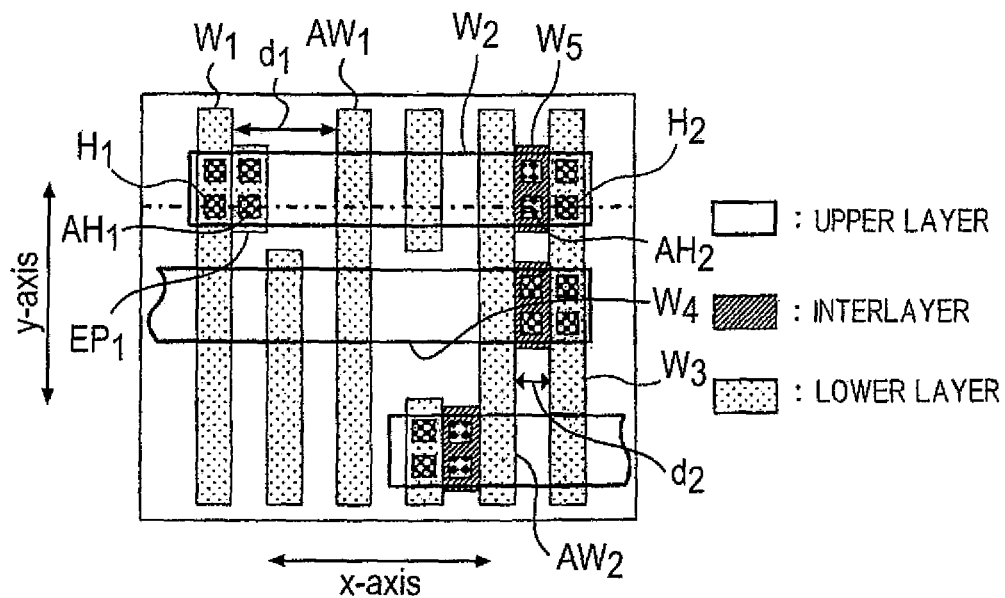
Figure 8D:
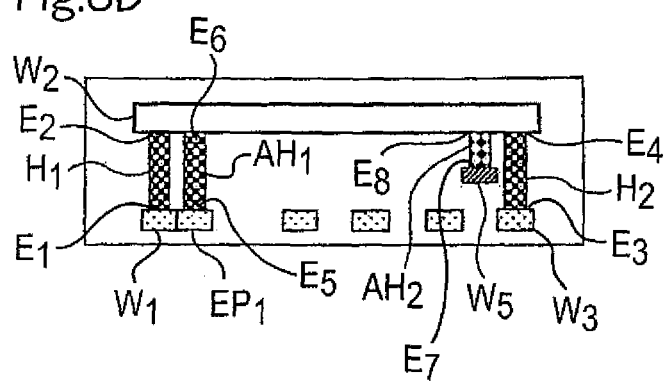

FIGS. 8C and 8D show a first through-hole H1 and a second through-hole H2 extracted from the design data. The extractor 10 may extract the existing through holes (i.e., H1, H2, . . . etc.) that interconnect upper layer wirings and lower layer wirings from input design data. The first through-hole H1 includes a first end E1 connected to a first wiring W1 at a lower layer extending in a first direction (i.e., along the y-axis) and a second end E2 connected to a second wiring W2 at an upper layer extending in a second direction (i.e., along the x-axis). The second through-hole H2 includes a first end E3 connected to a third wiring W3 at the lower layer extending in the first direction and a second end E4 connected to the second wiring W2. The second through-hole H2 may be connected to the third wiring W3 and a fourth wiring W4 in the upper layer, such that the first end E3 connected to the third wiring W3 and the second end E4 is connected to the fourth wiring W4. A distance d1 between the first wiring W1 and a first adjacent wiring AH1 at the lower layer along the second direction adjacent to the first wiring W1, may be larger than a distance d2 between the third wiring W3 and a second adjacent wiring AW2 at the lower layer in the second direction adjacent to the third wiring W3.

Then, the through-hole adder 40 arranges a first additional through-hole AH1 adjacent to the first through-hole H1 such that the first additional through-hole AH1 is arranged between the first through-hole H1 and the first adjacent wiring AW1, the first additional through-hole AH1 including a first end E5 connected to an extended portion EP1 of the first wiring W1 and a second end E6 connected to the second wiring W2, and arranges a second additional through-hole AH2 adjacent to the second through-hole H2 such that the second additional through-hole AH2 is arranged between the second through-hole H2 and the second adjacent wiring AW2, the second additional through-hole AH2 including a first end E7 connected to a fifth wiring W5 at an interlayer different from the lower layer and upper layer and a second end E8 connected to the second wiring W2. The second additional through-hole AH2 may be connected to the fifth wiring W5 and the fourth wiring W4 in the upper layer, such that the first end E7 connected to the fifth wiring W5 and the second end E8 is connected to the fourth wiring W4.

Figure 14A:
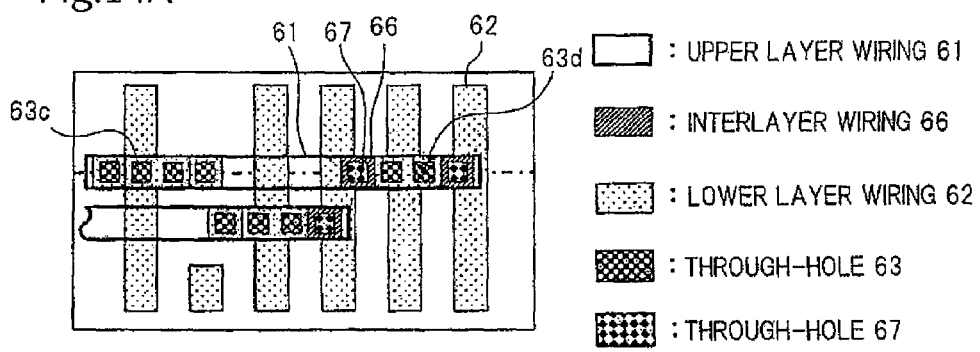
FIGS. 14A-14D are diagrams illustrating operation of the through-hole layout apparatus shown in FIG. 9.
Figure 14B:
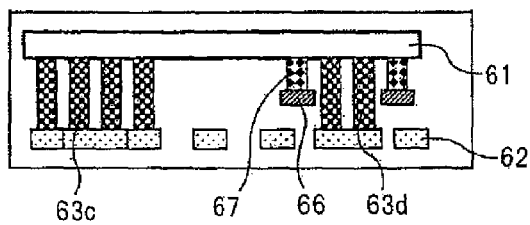
Figure 14C:
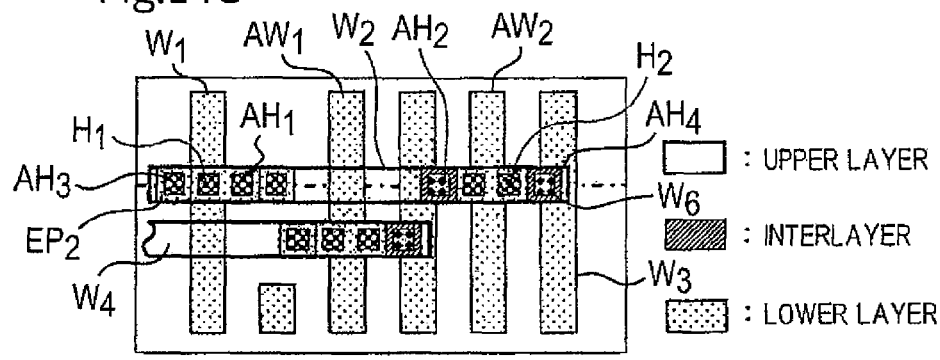
Figure 14D:
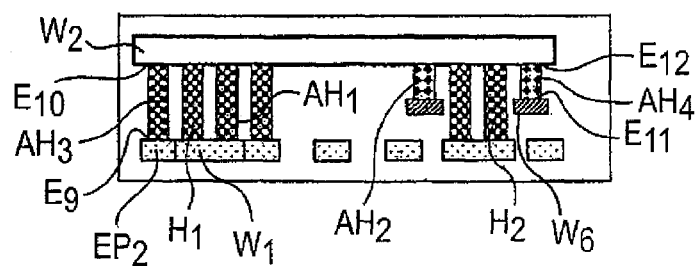

In addition, as shown in FIGS. 14C and 14D, the through-hole adder 40 may arrange a third additional through-hole AH3 adjacent to the first through-hole H1 such that the first through-hole H1 is arranged between the third additional through-hole AH3 and the first additional through-hole AH1, the third additional through-hole AH3 including a first end E9 connected to a second extended portion EP2 of the first wiring W1 and a second end E10 connected to the second wiring W2 and may arrange a fourth additional through-hole AH4 adjacent to the second through-hole H2 such that the second through-hole H2 is arranged between the second additional through-hole AH2 and the fourth additional through-hole AH4, the fourth additional through-hole AH4 including a first end E11 connected to a sixth wiring W6 at the interlayer and a second end E12 connected to the second wiring W2. The fourth additional through-hole AH4 may be connected to the sixth wiring W6 and the fourth wiring W4, such that the first end E11 connected to the sixth wiring W6 and the second end E12 is connected to the fourth wiring W4.

Second Exemplary Embodiment

A through-hole layout apparatus according to a second exemplary embodiment of the present invention differs from that of the first exemplary embodiment in that additional through-holes are added to semiconductor integrated circuit design data after the same through-hole adding process, as that in the first exemplary embodiment, is performed.

Figure 9:
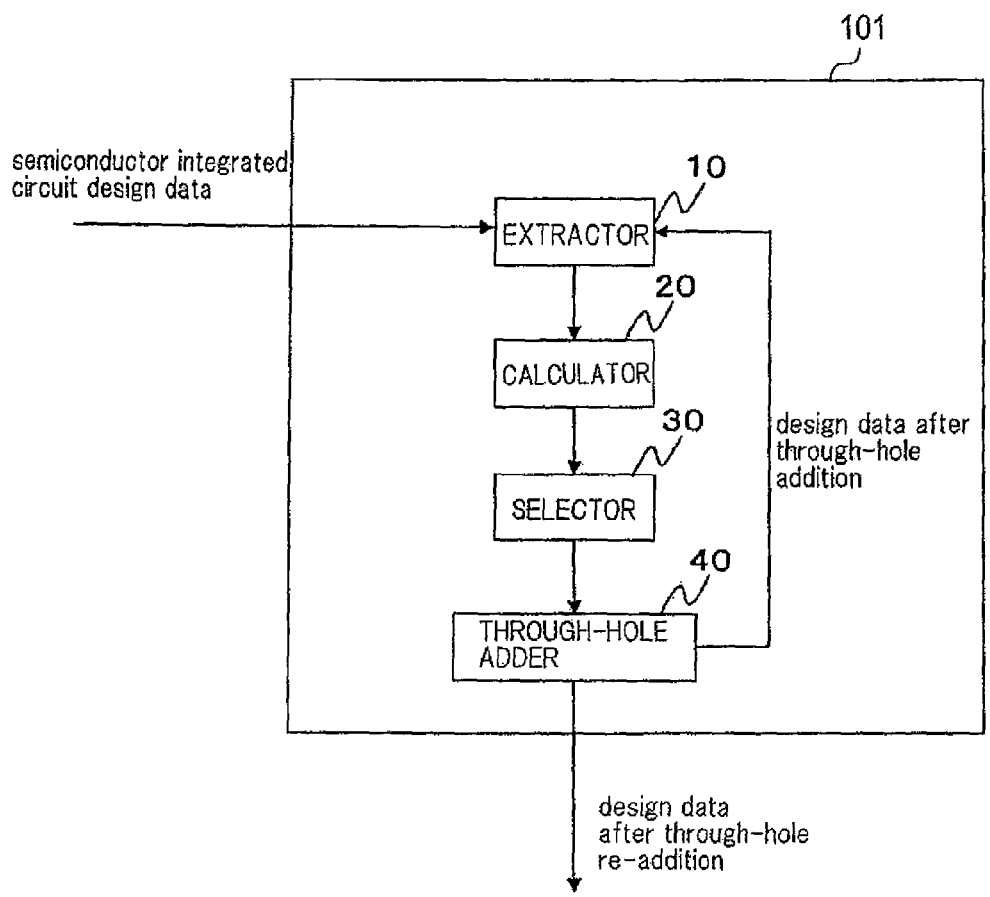
FIG. 9 is a block diagram showing a configuration of a through-hole layout apparatus according to a second exemplary embodiment of the present invention.

FIG. 9 shows a configuration of a through-hole layout apparatus according to the second exemplary embodiment.

As shown in FIG. 9, through-hole layout apparatus 101 according to the second exemplary embodiment has the same configuration as the first exemplary embodiment, except that following operations by the components are added.

When design data that is subjected to the process for adding through-holes by through-hole adder 40, referred to as processed design data, is input from through-hole adder 40 to extractor 10, extractor 10 extracts through-holes from the input processed design data.

Calculator 20 calculates, for each of the through-holes extracted by extractor 10, excluding through-holes added by through-hole adder 40 (referred to as added through-holes), the layout density of through-holes in a predetermined region centered on the through-hole.

Selector 30 determines, for each of the through-holes extracted by extractor 10, excluding the added through-holes, whether the layout density calculated by calculator 20 is greater than or equal to a predetermined value. Based on the result of the determination, selector 30 selects through-holes for which the layout density is lower than the predetermined value as target through-holes.

Through-hole adder 40 determines a second given position in a predetermined region centered on each of the target through-holes selected by selector 30 as the placement position where a through-hole is to be added and adds a through-hole at the placement position on the processed design data.

In particular, through-hole adder 40 performs the following process for each target through-hole.

First, through-hole adder 40 determines, as the placement position, a position in the predetermined region centered on the target-through-hole that is at a predetermined distance from the target through-hole in a predetermined direction and has room for extending an upper layer wiring that is connected to the target through-hole.

Then, through-hole adder 40 extends the upper layer wiring to the placement position. Through-hole adder 40 adds a through-hole for lower layer wiring or a through-hole for interlayer wiring, depending on whether there is room for extending a lower layer wiring that is connected to the target through-hole to a position corresponding to the placement position, at the placement position on the processed design data.

Through-hole adder 40 determines that a position in the predetermined region centered on the target through-hole that is at a predetermined distance in a predetermined direction, is on an upper layer wiring adjacent to the upper layer wiring that is connected to the target through-hole, and is a position where no through-hole is placed, as the placement position at which a through-hole is to be added and adds a through-hole for interlayer wiring at the placement position on the processed design data.

Figure 10:
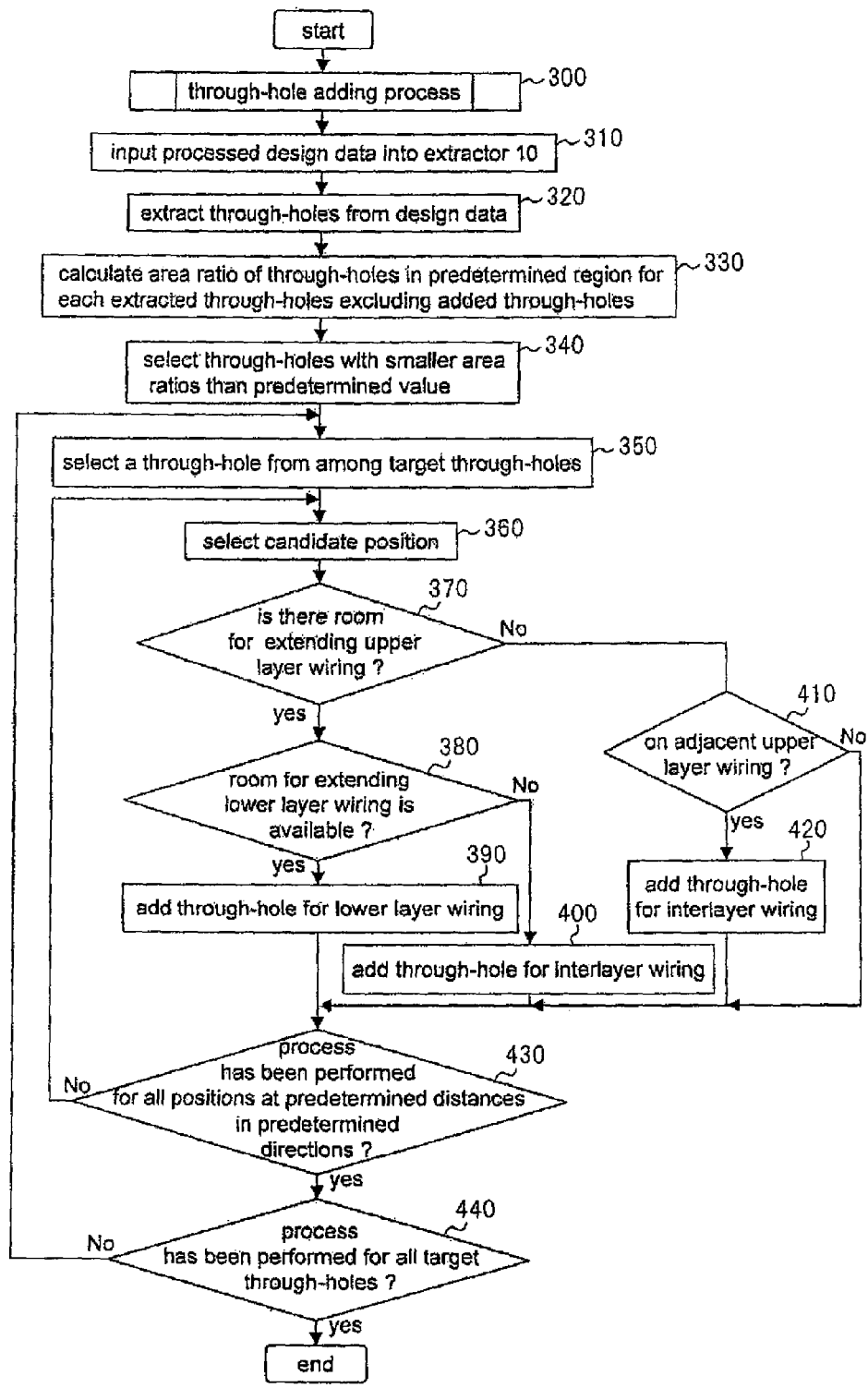
FIG. 10 is a flowchart illustrating operation of the through-hole layout apparatus shown in FIG. 9.

Operation of through-hole layout apparatus 101 according to the second exemplary embodiment will be descried with respect to a flowchart shown in FIG. 10.

(a) First Exemplary Operation

Figure 11A:
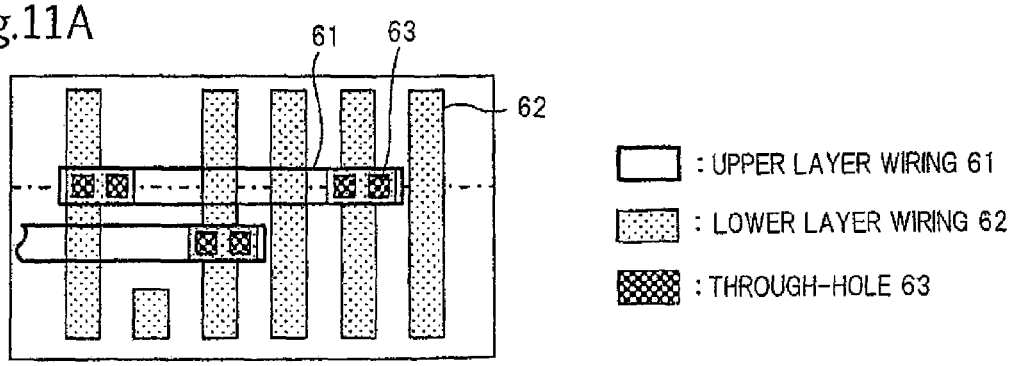
FIGS. 11A and 11B are diagrams illustrating another exemplary design data for a semiconductor integrated circuit.
Figure 11B:
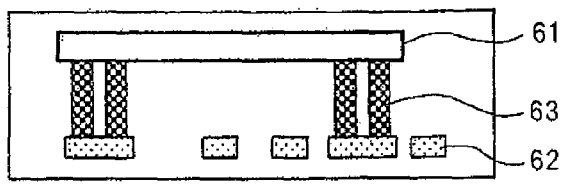

In a first example, semiconductor integrated circuit design data shown in FIGS. 11A and 11B is input in the through-hole layout apparatus.

Figure 12A:
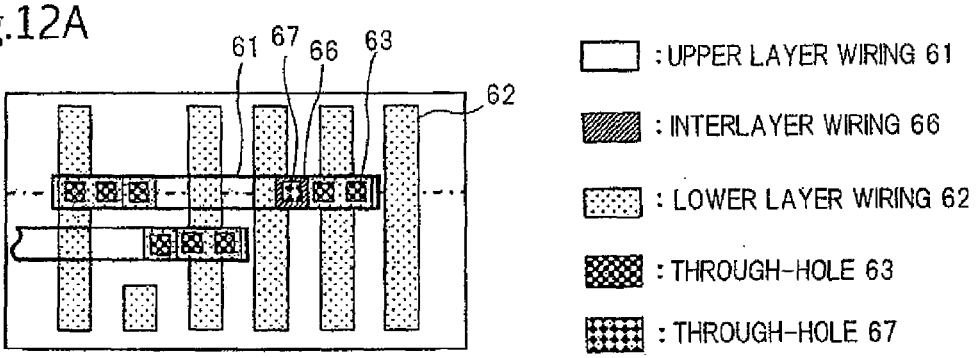
FIGS. 12A and 12B are diagrams illustrating operation of the through-hole layout apparatus shown in FIG. 9.
Figure 12B:
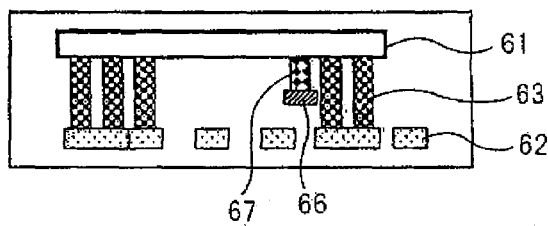

Referring to FIG. 10, when the semiconductor integrated circuit design data shown in FIGS. 11A and 11B is input, the same through-hole adding process that is illustrated in FIG. 3 is performed first and additional through-holes are placed on the design data as shown in FIGS. 12A and 12B (step 300). Through-holes 63 for lower layer wiring, each of those interconnects upper layer wiring 61 and lower layer wiring 62, are added as shown in FIGS. 12A and 12B. Through-hole 67 for interlayer wiring, that interconnects upper layer wiring 61 and interlayer wiring 66, is added as shown in FIGS. 12A and 12B.

Then, through-hole adder 40 inputs the processed design data to which the additional through-holes in FIGS. 12A and 12B have been placed into extractor 10 (step 310).

Extractor 10 extracts through-holes from the input processed design data (step 320).

Calculator 20 calculates, for each of the through-holes extracted by extractor 10, excluding the added through holes, the area ratio of the through-holes in a predetermined region centered on the through-hole as the layout density for the through-hole (step 330).

Selector 30 determines, for each of the through-holes extracted by extractor 10, excluding the added through-holes, whether the area ratio calculated by calculator 20 is greater than or equal to a predetermined value. Based on the result of the determination, selector 30 selects through-holes for which the area ratios are smaller than the predetermined value as target through-holes (step 340). It is assumed here that multiple through-holes including through-holes 63c, 63d in FIGS. 13A and 13B are selected as the target through-holes.

Figure 13A:
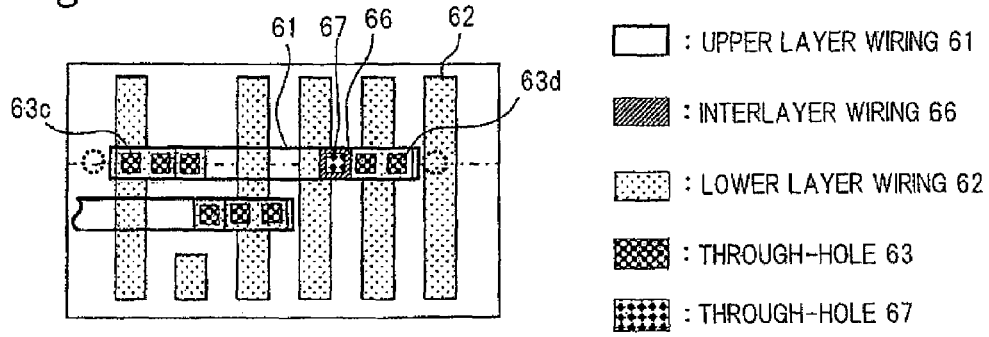
FIGS. 13A and 13B are diagrams illustrating operation of the through-hole layout apparatus shown in FIG. 9.
Figure 13B:
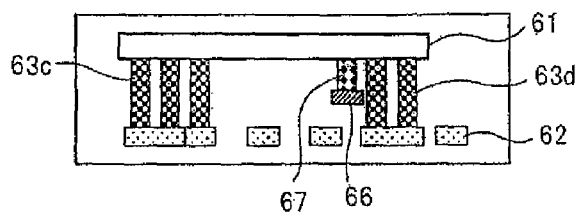

Then, through-hole adder 40 selects one from among the multiple target through-holes in FIGS. 13A and 13B selected by selector 30 (step 350). It is assumed here that through-hole 63c is selected.

Through-hole adder 40 then selects a position in a predetermined region centered on through-hole 63c that is at a predetermined distance from through-hole 63c in a predetermined direction as a candidate position (step 360). It is assumed here that a position at the predetermined distance to the left from through-hole 63c (the position indicated by a dotted circle in FIG. 13A) is selected as the candidate position.

Through-hole adder 40 then determines whether there is room for extending upper layer wiring 61 that is connected to through-hole 63c to the candidate position (step 370). It is assumed in the present exemplary embodiment that upper layer wiring 61 can be extended only in a direction parallel to the upper layer wiring.

Here, since there is room for extending upper layer wiring 61 as shown in FIGS. 13A and 13B, through-hole adder 40 determines the candidate position as the placement position.

Then, through-hole adder 40 extends upper layer wiring 61 to the placement position and determines whether there is room for extending lower layer wiring 62 that is connected to through-hole 63c to a position corresponding to the placement position (step 380).

Here, since there is room for extending lower layer wiring 62 as shown in FIGS. 13A and 13B, through-hole adder 40 extends lower layer wiring 62 to the placement position and adds through-hole 63 for lower layer wiring at the placement position on the processed design data (step 390).

Then, through-hole adder 40 performs steps 360 through 420 for all positions at predetermined distances from through-hole 63c in predetermined directions in the predetermined region centered on through-hole 63c (step 430). Here, since upper layer wiring 61 that is connected to through-hole 63c can be extended only to the left from through-hole 63c as shown in FIGS. 13A and 13B, a through-hole is not placed at any position at a predetermined distance from through-hole 63c in the directions other than left.

If there is an additional target through-hole selected by selector 30 that has yet to be subjected to processing in steps 350 through 430 (step 440), through-hole adder 40 returns to step 350 and selects the next target through-hole. It is assumed here that through-hole 63d in FIGS. 13A and 13B is selected.

Then, through-hole adder 40 selects a position at a predetermined distance from through-hole 63d in a predetermined direction in a predetermined region centered on through-hole 63d as a candidate position (step 360). It is assumed here that a position (indicated by another dotted circle in FIG. 13A) at a predetermined distance to the right from through-hole 63d is selected as the candidate position.

Through-hole adder 40 then determines whether there is room for extending upper layer wiring 61 that is connected to through-hole 63d to the candidate position (step 370).

Here, since there is room for extending upper layer wiring 61 as shown in FIGS. 13A and 13B, through-hole adder 40 determines the candidate position as the placement position.

Through-hole adder 40 extends upper layer wiring 61 to the placement position and determines whether there is room for extending lower layer wiring 62 that is connected to through-hole 63d to a position corresponding to the placement position (step 380).

Here, since there is no room for extending lower layer wiring 62, as shown in FIGS. 13A and 13B, through-hole adder 40 places interlayer wiring 66 at a position corresponding to the placement position between upper layer wiring 61 and lower layer wiring 62 and adds through-hole 67 for interlayer wiring at the placement position on the processed design data as shown in FIGS. 14A and 14B (step 400).

Then, through-hole adder 40 performs processing in steps 350 through 420 for all positions at the predetermined distances from through-hole 63d in predetermined directions in the predetermined region centered on through-hole 63d (step 430). Here, upper layer wiring 61 that is connected to through-hole 63d can be extended only to the right from through-hole 63d as shown in FIGS. 13A and 13B, and a through-hole is not placed at any position at a predetermined distance in the directions other than right.

When processing in steps 350 through 430 have been performed for all target through-holes selected by selector 30, through-hole adder 40 will end the process for re-adding a through-hole.

(b) Second Exemplary Operation

Figure 15A:
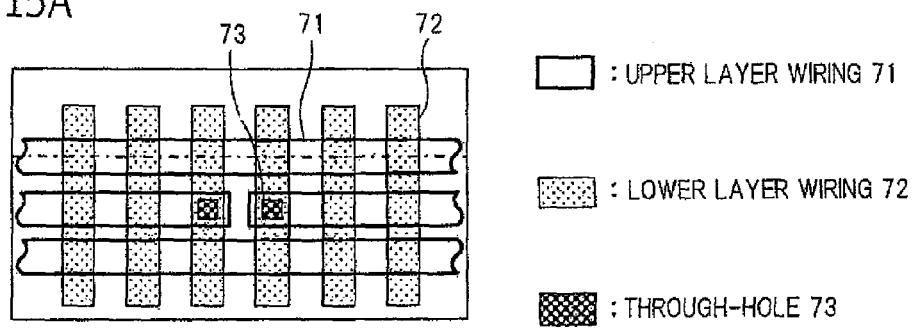
FIGS. 15A and 15B are diagrams showing yet another exemplary design data for a semiconductor integrated circuit.
Figure 15B:
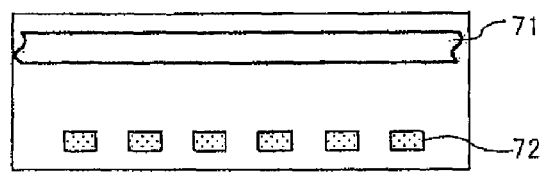

In a second example, semiconductor integrated circuit design data shown in FIGS. 15A and 15B is input.

Figure 16A:
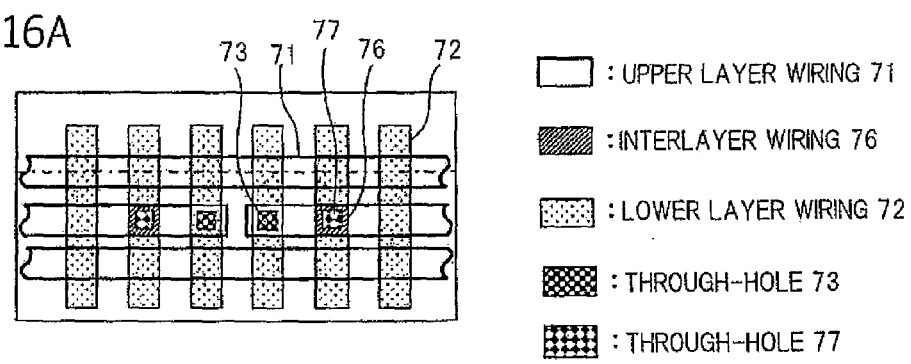
FIGS. 16A and 16B are diagrams illustrating operation of the through-hole layout apparatus shown in FIG. 9.
Figure 16B:
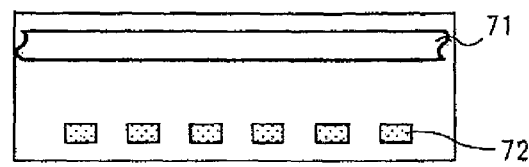

Referring to FIG. 10, when semiconductor integrated circuit design data shown in FIGS. 15A and 15B is input, the same through-hole adding process as in FIG. 3 is performed first and through-holes are added to the design data as shown in FIGS. 16A and 16B (step 300). Through-hole 77 for interlayer wiring, that interconnects upper layer wiring 71 and interlayer wiring 76, is added as shown in FIGS. 16A and 16B.

Then through-hole adder 40 inputs the processed design data to which the through-holes shown FIGS. 16A and 16B have been added into extractor 10 (step 310).

Extractor 10 extracts through-holes from the input processed design data (step 320).

Calculator 20 calculates, for each of the through-holes extracted by extractor 10, excluding the added through holes, the area ratio of the through-holes in a predetermined region centered on the through-hole as the layout density for the through-hole (step 330).

Selector 30 determines, for each of the through-holes extracted by extractor 10, excluding the added through-holes, whether the area ratio calculated by calculator 20 is greater than or equal to a predetermined value. Based on the result of the determination, selector 30 selects through-holes for which the area ratios are smaller than the predetermined value as target through-holes (step 340). It is assumed here that multiple through-holes including through-hole 73e in FIGS. 17A and 17B are selected as the target through-holes.

Figure 17A:
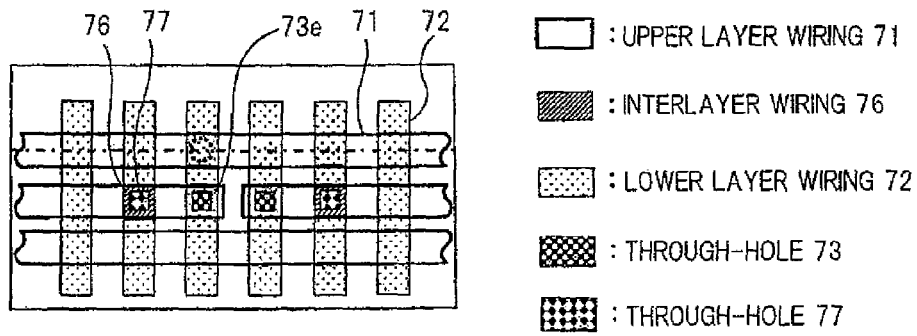
FIGS. 17A and 17B are diagrams illustrating operation of the through-hole layout apparatus shown in FIG. 9.
Figure 17B:
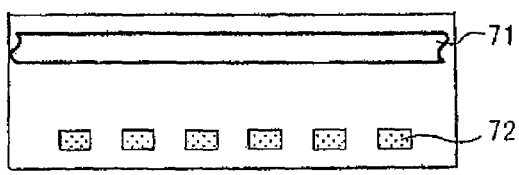

Then, through-hole adder 40 selects one from among the multiple target through-holes in FIGS. 17A and 17B selected by selector 30 (step 350). It is assumed here that through-hole 73e is selected.

Through-hole adder 40 then selects a position in a predetermined region centered on through-hole 73e that is at a predetermined distance from through-hole 73e in a predetermined direction as a candidate position (step 360). It is assumed here that a position at the predetermined distance above through-hole 73e (the position indicated by a dotted circle in FIGS. 17A and 17B) is selected as the candidate position.

Through-hole adder 40 then determines whether there is room for extending upper layer wiring 71 that is connected to through-hole 73e to the candidate position (step 370).

Here, since there is no room for extending upper layer wiring 71, as shown in FIGS. 17A and 17B, through-hole adder 40 determines whether the candidate position is on an upper layer wiring adjacent to upper layer wiring 71 that is connected to through-hole 73e (step 410).

Here, since the candidate position is on the adjacent upper layer wiring as shown in FIGS. 17A and 17B, through-hole adder 40 determines the candidate position as the placement position.

Figure 18A:
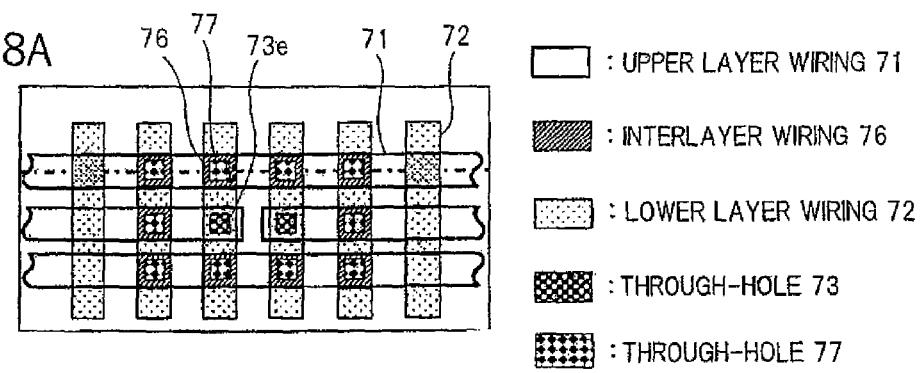
FIGS. 18A and 18B are diagrams illustrating operation of the through-hole layout apparatus shown in FIG. 9.
Figure 18B:
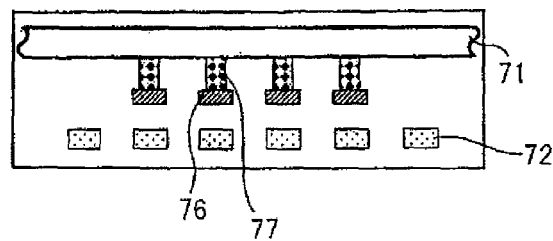

Through-hole adder 40 then places interlayer wiring 76 in a position corresponding to the placement position between upper layer wiring 71 and lower layer wiring 72 and adds through-hole 77 for interlayer wiring at the placement position on the processed design data as shown in FIGS. 18A and 18B (step 420).

Then, through-hole adder 40 performs processing in steps 360 through 420 for all positions at the predetermined distance from through-hole 73e in the predetermined directions in the predetermined region centered on through-hole 73e (step 430). As a result, through-holes 77 for interlayer wirings are placed at the predetermined distances below, to the upper right, lower right, upper left, and lower left from through-hole 73e on the processed design data as shown in FIGS. 18A and 18B.

After processing in steps 350 through 430 is performed for all target through-holes selected by selector 30, through-hole adder 40 will end the process for re-adding a through-hole.

As has been described above, according to the second exemplary embodiment, after the through-hole adding process is performed on semiconductor integrated circuit design data, through-holes are extracted from the processed design data, the layout density of through-holes in a predetermined region centered on each of the extracted through-holes, excluding the added through-holes, is calculated and, for each through-hole for which the layout density is lower than a predetermined value, an additional through hole is placed at a second predetermined placement position in the predetermined region centered on the through-hole on the processed design data.

This process further reduces differences in through-hole layout density as compared with the first exemplary embodiment. Therefore, the yield of semiconductor integrated circuits can be further improved.

According to the present invention, existing through-holes are extracted from design data for a semiconductor integrated circuit, the layout density of through-holes in a predetermined region centered on each extracted through-hole is calculated, and a through-hole is added to the design data at a given position in a predetermined region centered on a through-hole where the layout density is lower than a predetermined value.

According to the present invention, differences in layout density of through-holes are reduced. Accordingly, the yield of semiconductor integrated circuits can be improved without using a dummy pattern which is not specified in a process design criterion. Thus, the present invention has the effects of preventing a significant increase in the number of steps for developing a semiconductor integrated circuit and avoiding an increase in the complexity of the inspection process for the semiconductor integrated circuit.

It is apparent that the present invention is not limited to the above embodiments, but may be modified and changed without departing from the scope and spirit of the invention.

What is claimed is:

1. A through-hole layout apparatus comprising:
an extractor, implemented by a processor, configured to extract a plurality of through-holes interconnecting an upper layer wiring and a lower layer wiring from design data for a semiconductor integrated circuit;
a calculator, implemented by the processor, configured to calculate, for each of the plurality of through-holes extracted by said extractor, a layout density of through-holes in a corresponding predetermined region centered on each of said though-holes, respectively;
a selector, implemented by the processor, configured to select a target through-hole among said plurality through-holes extracted by the extractor, where said layout density calculated by said calculator for the target through-hole is lower than a predetermined value; and
a through-hole adder, implemented by the processor, configured to determine, for the target through-hole selected by the selector, a first given position in the corresponding predetermined region centered on said target through-hole as a placement position at which a through-hole is to be added and adding a through-hole at said placement position on said design data.

2. The through-hole layout apparatus according to claim 1, wherein said first given position in said predetermined region is at a predetermined distance from said target through-hole in a predetermined direction in said predetermined region, is on an upper layer wiring that is connected to said target through-hole, and is a position where no through-hole is placed.

3. The through-hole layout apparatus according to claim 2, wherein if there is room for extending an lower layer wiring that is connected to said target through-hole to a position corresponding to said placement position, said through-hole adder extends said lower layer wiring to said position corresponding to said placement position and adds a through-hole interconnecting said upper layer wiring and said lower layer wiring at said placement position on said design data.

4. The through-hole layout apparatus according to claim 2, wherein if there is no room for extending an lower layer wiring that is connected to said target through-hole to a position corresponding to said placement position, said through-hole adder places an interlayer wiring at a position corresponding to said placement position between said upper layer wiring and said lower layer wiring and adds a through-hole interconnecting said upper layer wiring and said interlayer wiring at said placement position on said design data.

5. The through-hole layout apparatus according to claim 1, wherein:

said extractor extracts a plurality of through-holes from processed design data to which a through-hole has been added by said through-hole adder;

said calculator calculates, for each of the plurality of through-holes extracted by said extractor, excluding the through-hole added by said through-hole adder, the layout density of through-holes in the corresponding predetermined region centered on each of said though-holes, respectively;

said selector selects a target through-hole among the plurality of through-holes, excluding said through-holes added by said through-hole adder, where said layout density calculated by said calculator for the target through hole is lower than the predetermined value; and said through-hole adder determines, for the target through-hole selected by said selector, a second given position in the predetermined region centered on said target through-hole as a placement position at which a through-hole is to be added and adds a through-hole at said placement position on said processed design data.

6. The through-hole layout apparatus according to claim 5, wherein said second given position in said predetermined region is a position at said predetermined distance from said target through-hole at said predetermined direction in said predetermined region and is a position where there is room for extending an upper layer wiring that is connected to said target through-hole, or a position which is on an upper layer wiring adjacent to said upper layer wiring and at which no through-hole is placed.

7. The through-hole layout apparatus according to claim 6, wherein if said placement position is a position at which there is room for extending said upper layer wiring that is connected to said target through-hole, said through-hole adder extends said upper layer wiring to said placement position and, if there is room for extending a lower layer wiring that is connected to said target through-hole to a position corresponding to said placement position, extends said lower layer wiring to said position corresponding to said placement position and adds a through-hole interconnecting said upper layer wiring and said lower layer wiring at said placement position on said processed design data.

8. The through-hole layout apparatus according to claim 6, wherein if said placement position is a position at which there is room for extending said upper layer wiring that is connected to said target through-hole, said through-hole adder extends said upper layer wiring to said placement position and, if there is no room for extending a lower layer wiring that is connected to said target through-hole to a position corresponding to said placement position, places an interlayer wiring at a position corresponding to said placement position between said upper layer wiring and said lower layer wiring and adds a through-hole interconnecting said upper layer wiring and said interlayer wiring at said placement position on said processed design data.

9. The through-hole layout apparatus according to claim 6, wherein if said placement position is on said adjacent upper layer wiring and is a position where no through-hole is placed, said through-hole adder places an interlayer wiring at a position corresponding to said placement position between said upper layer wiring and said interlayer wiring and adds a through-hole interconnecting said upper layer wiring and said lower layer wiring at said placement position on said processed design data.

10. A through-hole layout method performed by a through-hole layout apparatus, comprising:

extracting, by a processor, a plurality of through-holes interconnecting an upper layer wiring and a lower layer wiring from design data for a semiconductor integrated circuit;

calculating, for each of the plurality of extracted through-holes, a layout density of through-holes in a corresponding predetermined region centered on each of said though-holes, respectively;

selecting a target through-hole among said plurality of through-holes where said calculated layout density for the target through-hole is lower than a predetermined value;

determining, for the selected target through-hole, a given position in the predetermined region centered on said target through-hole as a placement position at which a through-hole is to be added; and adding a through-hole at said placement position on said design data.

11. The through-hole layout method according to claim 10, wherein said first given position in said predetermined region is at a predetermined distance from said target through-hole in a predetermined direction in said predetermined region, is on an upper layer wiring that is connected to said target through-hole, and is a position where no through-hole is placed.

12. The through-hole layout method according to claim 11, wherein, in adding a through-hole at said placement position, if there is room for extending an lower layer wiring that is connected to said target through-hole to a position corresponding to said placement position, said lower layer wiring is extended to a position corresponding to said placement position and a through-hole interconnecting said upper layer wiring and said lower layer wiring is added at said placement position on said design data.

13. The through-hole layout method according to claim 11, wherein, in adding a through-hole at said placement position, if there is no room for extending an lower layer wiring that is connected to said target through-hole to a position corresponding to said placement position, an interlayer wiring is placed at a position corresponding to said placement position between said upper layer wiring and said lower layer wiring and a through-hole interconnecting said upper layer wiring and said interlayer wiring is added at said placement position on said design data.

14. The through-hole layout method according to claim 10, wherein, in adding a through-hole in said placement position,
re-extraction is performed to extract a plurality of through-holes from processed design data to which a through-hole has been added;
recalculation is performed to calculate, for each of said plurality of through-holes extracted by said re-extraction excluding said through-hole added to said placement position, a layout density of through-holes in corresponding predetermined region centered on each of said though-holes, respectively;
re-selection is performed to select a target through-hole among said plurality of through-holes where said layout density calculated by said recalculation is lower than a predetermined value; and
re-addition is performed by determining, for each target through-hole selected by said reselection, a second given position in a predetermined region centered on said target through-hole as a placement position at which a through-hole is to be added and adding a through-hole at said placement position on the processed design data.

15. The through-hole layout method according to claim 14, wherein said second given position in said predetermined region is a position at said predetermined distance from said target through-hole at said predetermined direction in said predetermined region and is a position where there is room for extending an upper layer wiring that is connected to said target through-hole, or a position which is on an upper layer wiring adjacent to said upper layer wiring and at which no through-hole is placed.

16. The through-hole layout method according to claim 15, wherein in performing said re-addition, if said placement position is a position at which there is room for extending said upper layer wiring that is connected to said target through-hole, said upper layer wiring is extended to said placement position and, if there is room for extending a lower layer wiring that is connected to said target through-hole to a position corresponding to said placement position, said lower layer wiring is extended to said position corresponding to said placement position and a through-hole interconnecting said upper layer wiring and said lower layer wiring is added at said placement position on said processed design data.

17. The through-hole layout method according to claim 15, wherein in performing said re-addition, if said placement position is a position at which there is room for extending said upper layer wiring that is connected to said target through-hole, said upper layer wiring is extended to said placement position and, if there is no room for extending a lower layer wiring that is connected to said target through-hole to a position corresponding to said placement position, an interlayer wiring is placed at a position corresponding to said placement position between said upper layer wiring and said lower layer wiring and a through-hole interconnecting said upper layer wiring and said interlayer wiring is added at said placement position on said processed design data.

18. The through-hole layout method according to claim 15, wherein in performing said re-addition, if said placement position is on said adjacent upper layer wiring and is a position where no through-hole is placed, an interlayer wiring is placed at a position corresponding to said placement position between said upper layer wiring and said lower layer wiring and a through-hole interconnecting said upper layer wiring and said interlayer wiring is added at said placement position on said processed design data.

19. A method of forming a layout of a through-hole by a layout apparatus, comprising;
receiving a design data of a semiconductor circuit by the layout apparatus;
extracting, by a processor, a first through-hole and a second through-hole from the design data, the first through-hole including a first end connected to a first wiring at a first layer level extending in a first direction and a second end connected to a second wiring at a second layer level extending a second direction different from the first direction, the second through-hole including a first end connected to a third wiring at the first layer level extending in the first direction and a second end connected to a fourth wiring at the second layer level extending the second direction, a distance between the first wiring and a first adjacent wiring at the first layer level in the second direction adjacent to the first wiring, being larger than a distance between the third wiring and a second adjacent wiring at the first layer level in the second direction adjacent to the third wiring;
arranging, by the processor, a first additional through-hole adjacent to the first through-hole such that the first additional through-hole is arranged between the first through-hole and the first adjacent wiring, the first additional through-hole including a first end connected to an extended portion of the first wiring and a second end connected to the second wiring;
arranging, by the processor, a second additional through-hole adjacent to the second through-hole such that the second additional through-hole is arranged between the second through-hole and the second adjacent wiring, the second additional through-hole including a first end connected to a fifth wiring at a third layer level different from the first and second layer levels and a second end connected to the fourth wiring; and
outputting a design data of the semiconductor circuit which are added to the first and second additional through-holes.

20. The method as claimed in claim 19, wherein the third layer level is positioned between the first and second layer levels.

21. The method as claimed in claim 20, wherein the second wiring and the fourth wiring constitute a single wiring.

22. The method as claimed in claim 21, further comprising:
arranging, by the through-hole adder, a third additional through-hole adjacent to the first through-hole such that the first through-hole is arranged between the third additional through-hole and the first additional through-hole, the third additional through-hole including a first end connected to a second extended portion of the first wiring and a second end connected to the second wiring; and
arranging, by the through-hole adder, a fourth additional through-hole adjacent to the second through-hole such that the second through-hole is arranged between the second additional through-hole and the fourth additional through-hole, the fourth additional through-hole including a first end connected to a sixth wiring at the third layer level and a second end connected to the fourth wiring.

* * * * *